US012572992B2

(12) United States Patent
Srinivasan et al.

(10) Patent No.: US 12,572,992 B2
(45) Date of Patent: Mar. 10, 2026

(54) SYSTEMS AND METHODS FOR AUTOMATED BUILDING CODE CONFORMANCE

(71) Applicant: University of Florida Research Foundation, Inc., Gainesville, FL (US)

(72) Inventors: Ravi Shankar Srinivasan, Gainesville, FL (US); Nawari O. Nawari, Gainesville, FL (US)

(73) Assignee: University of Florida Research Foundation, Inc., Gainesville, FL (US)

( * ) Notice: Subject to any disclaimer, the term of this patent is extended or adjusted under 35 U.S.C. 154(b) by 0 days.

(21) Appl. No.: 18/662,631

(22) Filed: May 13, 2024

(65) Prior Publication Data

US 2024/0296509 A1     Sep. 5, 2024

Related U.S. Application Data

(63) Continuation of application No. 17/559,504, filed on Dec. 22, 2021, now Pat. No. 12,020,339.

(Continued)

(51) Int. Cl.
*G06Q 30/00*          (2023.01)
*G06F 30/20*          (2020.01)
(Continued)

(52) U.S. Cl.
CPC ........... *G06Q 50/165* (2013.01); *G06F 30/20* (2020.01); *G06Q 10/06313* (2013.01)

(58) Field of Classification Search
None
See application file for complete search history.

(56) References Cited

U.S. PATENT DOCUMENTS

| | | | | |
|---|---|---|---|---|
| 2008/0059220 A1* | 3/2008 | Roth | ...................... | G06Q 50/18 |
| | | | | 705/317 |
| 2009/0125283 A1* | 5/2009 | Conover | ................ | G06Q 10/10 |
| | | | | 703/1 |

(Continued)

FOREIGN PATENT DOCUMENTS

WO          2019144200 A1      8/2019

OTHER PUBLICATIONS

Nawari, Nawari O .: "A Generalized Adaptive Framework (GAF) for Automating Code Compliance Checking", Buildings, vol. 9, No. 4, Apr. 16, 2019 (Apr. 16, 2019) (Year: 2019).*

(Continued)

*Primary Examiner* — Matthew T Sittner
(74) *Attorney, Agent, or Firm* — Thomas I Horstemeyer, LLP

(57) ABSTRACT

The present disclosure describes system and methods for determination of building code performance. One such method comprises transforming a building code regulation into a computable record that defines a building design and/or engineering rule for the building code regulation; performing design model validation, wherein design model validation comprises entering building permit application file information and checking the building permit application file information against relevant codes and regulations, using a taxonomy or neural natural language processing techniques or artificial Intelligence; performing exchange model code checking; performing code conformance checking, wherein the code conformance checking comprises receiving a request from the exchange models and passing the building permit application file information to code checking modules; performing verification reporting based on input provided from the code checking modules; and performing results reporting based on findings of the verification reporting.

14 Claims, 9 Drawing Sheets

Related U.S. Application Data

(60) Provisional application No. 63/143,368, filed on Jan. 29, 2021.

(51) Int. Cl.
G06Q 10/0631 (2023.01)
G06Q 50/16 (2024.01)

(56) References Cited

U.S. PATENT DOCUMENTS

| | | | | |
|---|---|---|---|---|
| 2012/0290492 | A1 | 11/2012 | Rodriguez | |
| 2018/0253510 | A1* | 9/2018 | Shen | G06F 30/13 |
| 2019/0303512 | A1* | 10/2019 | Davies | G06N 3/0464 |
| 2021/0073433 | A1* | 3/2021 | Austern | G06F 30/13 |
| 2021/0264576 | A1* | 8/2021 | Sun | G06T 5/94 |

OTHER PUBLICATIONS

Eastman, "Exchange Model and Exchange Object Concepts for Implementation of National BIM Standards" 25-34, Journal of Computing in Civil Engineering. [Online], Jan. 2010; pp. 25-34; [Retrieved on Mar. 17, 2022], (Year: 2010).*

Beach. "Towards the Adoption of Automated Regulatory Compliance Checking in the Built Environment" 1-45. Automation in Construction. [online]. May 26, 2020; Automation in Construction 118; pp. 1-45 (Year: 2020).*

An Investigation of the Methods of Logicalizing the Code-Checking System for Architectural Design Review in New Taipei City. By: Wei-I Lee; Nan-Chih Chiang. In: Applied Sciences (2076-3417), Dec. 2016. Applied Science & Technology Source. (Year: 2016).*

Search Report mailed on Nov. 14, 2024 for European Patent Application No. 22746900.4.

Nawari, Nawari O. "A generalized adaptive framework (GAF) for automating code compliance checking." Buildings 9.4 (2019): 86.

Thomas H. Beach et al. "Towards the Adoption of Automated Regulatory Compliance Checking in the Built Environment". <http://dx.doi.org/10.1016/j.autcon.2020.103285>. Pring submitted to Automation in Construction. pp. 1-11. May 26, 2020.

C. M. Eastman et al. "Exchange Model and Exchange Object Concepts for Implementation of National BIM Standards". Journal of Computing in Civil Engineering. pp. 25-34. Jan./Feb. 2010.

International Search Report and Written Opinion for International Application No. PCT/US2022/070341 mailed Apr. 29, 2022.

* cited by examiner

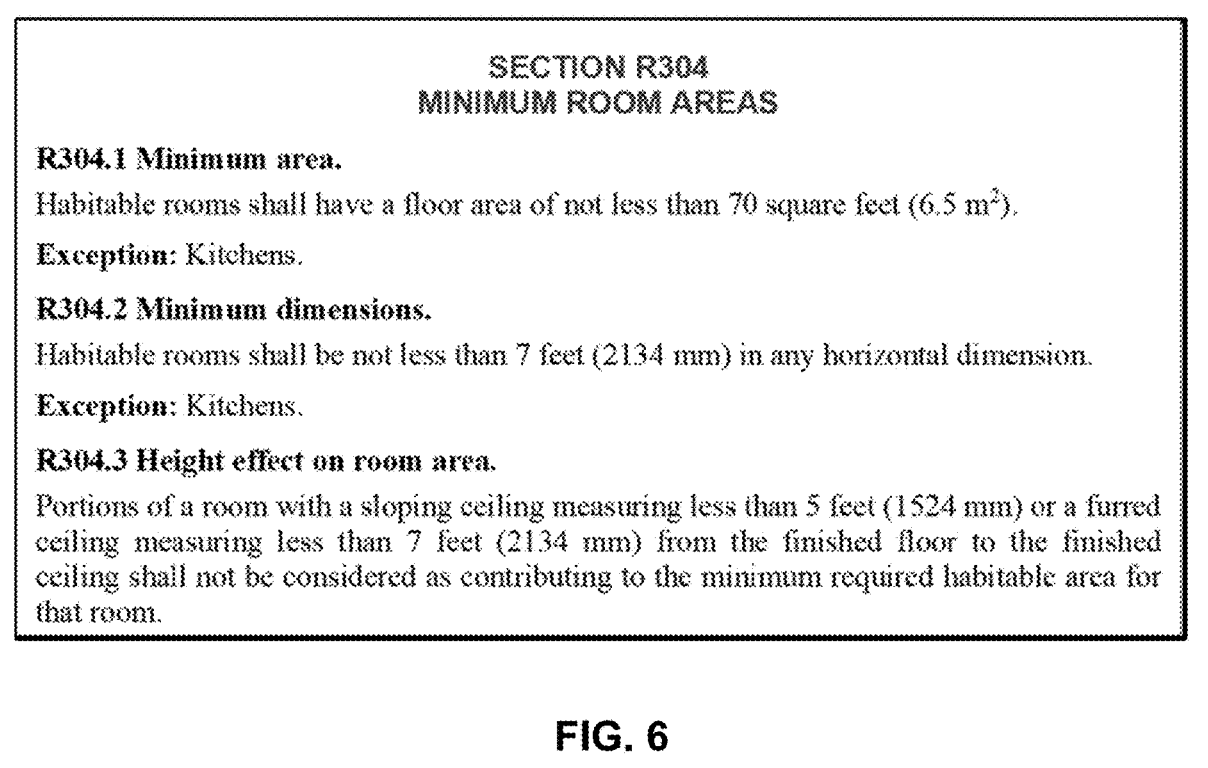

SECTION R304
MINIMUM ROOM AREAS

R304.1 Minimum area.

Habitable rooms shall have a floor area of not less than 70 square feet (6.5 m$^2$).

Exception: Kitchens.

R304.2 Minimum dimensions.

Habitable rooms shall be not less than 7 feet (2134 mm) in any horizontal dimension.

Exception: Kitchens.

R304.3 Height effect on room area.

Portions of a room with a sloping ceiling measuring less than 5 feet (1524 mm) or a furred ceiling measuring less than 7 feet (2134 mm) from the finished floor to the finished ceiling shall not be considered as contributing to the minimum required habitable area for that room.

FIG. 6

Real time Code Checking Wheel

SYSTEMS AND METHODS FOR AUTOMATED BUILDING CODE CONFORMANCE

CROSS-REFERENCE TO RELATED APPLICATIONS

This application is a continuation of co-pending U.S. utility application entitled, "Systems and Methods for Automated Building Code Conformance," having application Ser. No. 17/559,504, filed Dec. 22, 2021, which claims priority to U.S. Provisional Patent Application No. 63/143,368, filed on Jan. 29, 2021, each of which is hereby incorporated herein by reference as if set forth in full.

FIELD OF THE DISCLOSURE

The embodiments described herein are generally directed to building code conformance and, more particularly, to a platform that enables automated determination of building code compliance and that can assist with automated building permitting.

BACKGROUND

Generally, one needs to obtain a building permit from a local government office before one can construct a new building structure or modify a preexisting building structure. A building permit may include individual building, grading, plumbing, mechanical, and electrical permits. One can apply for a building permit when the plans for the proposed building project are completed. To apply, one can submit a permit application package to a local government office that oversees the jurisdiction. After the application is submitted, the government office will manually review the application and depending on the nature of the project, the review could involve several government departments that are required to enforce numerous Federal, State, and local construction and development regulations. As such, the review process generally takes several months.

If the application cannot be approved as submitted, then lists of necessary corrections from all the departments that reviewed the application is generally provided so that a revised or updated application can be provided. When the revised permit application is submitted, the application will be distributed to the departments that generated the initial corrections for subsequent manual review. After the local government office determines that the application satisfies all pertinent building code requirements, the application is approved and associated government fees are due to be paid. Upon payment, a building permit can be issued and construction can begin. As such, the process of issuing a building permit can be complex and slow.

SUMMARY

Accordingly, systems, methods, and non-transitory computer-readable media are disclosed for automated determination of building code performance.

According to one aspect, a method comprises using at least one hardware processor to: perform design model validation, wherein design model validation comprises entering building permit application file information and checking the building permit application file information against relevant codes, ordinances and regulations; perform exchange model code checking, wherein exchange model code checking comprises using a plurality of exchange models; perform code conformance checking, wherein the code conformance checking comprises receiving a request from the exchange models and passing the building permit application file information to code checking modules configured to check building code provisions and one or more ordinances and regulations per local, state, national or international requirements; perform verification reporting based on input provided from the code checking modules; and perform results reporting based on findings of the verification reporting.

The method may be embodied in executable software modules of a processor-based system, such as a server, and/or in executable instructions stored in a non-transitory computer-readable medium.

BRIEF DESCRIPTION OF THE DRAWINGS

The details of the present invention, both as to its structure and operation, may be gleaned in part by study of the accompanying drawings, in which like reference numerals refer to like parts.

FIG. 6 shows an example of building code provisions.

DETAILED DESCRIPTION

In an embodiment, systems, methods, and non-transitory computer-readable media are disclosed for automated determination of building code performance.

After reading this description, it will become apparent to one skilled in the art how to implement the various alternative embodiments and alternative applications described herein. However, although various embodiments are described herein, it is understood that these embodiments are presented by way of example and illustration only, and not limitation. As such, this detailed description of various embodiments should not be construed to limit the scope or breadth of the appended claims.

Figure 1:
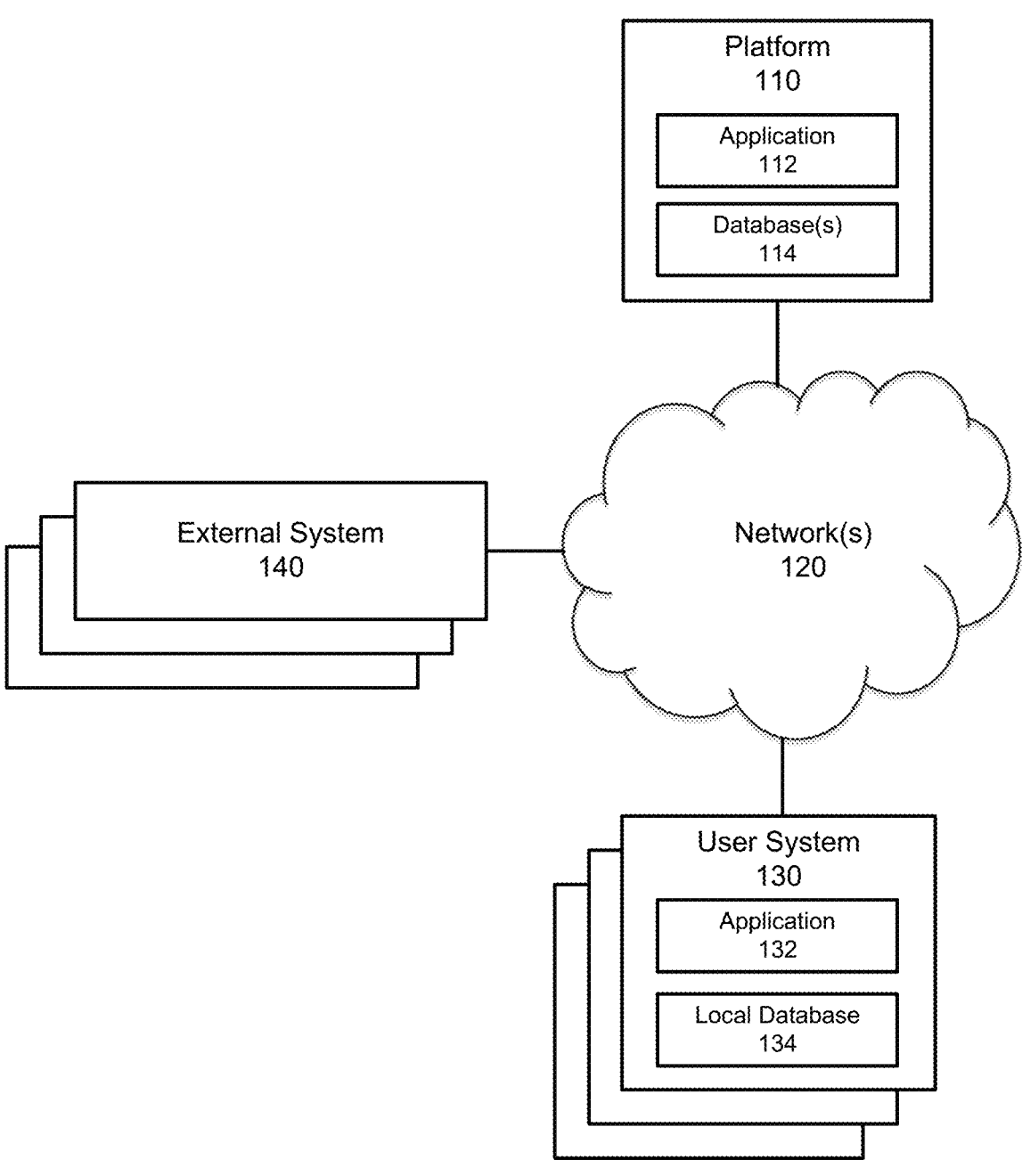
FIG. 1 illustrates an example infrastructure, in which one or more of the processes described herein, may be implemented, according to an embodiment.

FIG. 1 illustrates an example infrastructure in which one or more of the disclosed processes may be implemented, according to an embodiment. The infrastructure may comprise a platform 110 (e.g., one or more servers) which hosts and/or executes one or more of the various functions, processes, methods, and/or software modules described herein. Platform 110 may comprise dedicated servers, or may instead comprise cloud instances, which utilize shared resources of one or more servers. These servers or cloud instances may be collocated and/or geographically distributed. Platform 110 may also comprise or be communicatively connected to a server application 112 and/or one or more databases 114. In addition, platform 110 may be communicatively connected to one or more user systems 130 via one or more networks 120. Platform 110 may also be communicatively connected to one or more external systems 140 (e.g., other platforms, websites, etc.) via one or more networks 120.

Network(s) 120 may comprise the Internet, and platform 110 may communicate with user system(s) 130 through the Internet using standard transmission protocols, such as HyperText Transfer Protocol (HTTP), HTTP Secure (HTTPS), File Transfer Protocol (FTP), FTP Secure (FTPS), Secure Shell FTP (SFTP), and the like, as well as proprietary protocols. While platform 110 is illustrated as being connected to various systems through a single set of network(s) 120, it should be understood that platform 110 may be connected to the various systems via different sets of one or more networks. For example, platform 110 may be connected to a subset of user systems 130 and/or external systems 140 via the Internet, but may be connected to one or more other user systems 130 and/or external systems 140 via an intranet. Furthermore, while only a few user systems 130 and external systems 140, one server application 112, and one set of database(s) 114 are illustrated, it should be understood that the infrastructure may comprise any number of user systems, external systems, server applications, and databases.

User system(s) 130 may comprise any type or types of computing devices capable of wired and/or wireless communication, including without limitation, desktop computers, laptop computers, tablet computers, smart phones or other mobile phones, servers, game consoles, televisions, set-top boxes, electronic kiosks, point-of-sale terminals, Automated Teller Machines, and/or the like.

Platform 110 may comprise web servers which host one or more websites and/or web services. In embodiments in which a website is provided, the website may comprise a graphical user interface, including, for example, one or more screens (e.g., webpages) generated in HyperText Markup Language (HTML) or other language. Platform 110 transmits or serves one or more screens of the graphical user interface in response to requests from user system(s) 130. In some embodiments, these screens may be served in the form of a wizard, in which case two or more screens may be served in a sequential manner, and one or more of the sequential screens may depend on an interaction of the user or user system 130 with one or more preceding screens. The requests to platform 110 and the responses from platform 110, including the screens of the graphical user interface, may both be communicated through network(s) 120, which may include the Internet, using standard communication protocols (e.g., HTTP, HTTPS, etc.). These screens (e.g., webpages) may comprise a combination of content and elements, such as text, images, videos, animations, references (e.g., hyperlinks), frames, inputs (e.g., textboxes, text areas, checkboxes, radio buttons, drop-down menus, buttons, forms, etc.), scripts (e.g., JavaScript), and the like, including elements comprising or derived from data stored in one or more databases (e.g., database(s) 114) that are locally and/or remotely accessible to platform 110. Platform 110 may also respond to other requests from user system(s) 130.

Platform 110 may further comprise, be communicatively coupled with, or otherwise have access to one or more database(s) 114. For example, platform 110 may comprise one or more database servers which manage one or more databases 114. A user system 130 or server application 112 executing on platform 110 may submit data (e.g., user data, form data, etc.) to be stored in database(s) 114, and/or request access to data stored in database(s) 114. Any suitable database may be utilized, including without limitation MySQL™, Oracle™, IBM™, Microsoft SQL™, Access™, PostgreSQL™, and the like, including cloud-based databases and proprietary databases. Data may be sent to platform 110, for instance, using the well-known POST request supported by HTTP, via FTP, and/or the like. This data, as well as other requests, may be handled, for example, by server-side web technology, such as a servlet or other software module (e.g., comprised in server application 112), executed by platform 110.

In embodiments in which a web service is provided, platform 110 may receive requests from external system(s) 140, and provide responses in extensible Markup Language (XML), JavaScript Object Notation (JSON), and/or any other suitable or desired format. In such embodiments, platform 110 may provide an application programming interface (API) which defines the manner in which user system(s) 130 and/or external system(s) 140 may interact with the web service. Thus, user system(s) 130 and/or external system(s) 140 (which may themselves be servers), can define their own user interfaces, and rely on the web service to implement or otherwise provide the backend processes, methods, functionality, storage, and/or the like, described herein. For example, in such an embodiment, a client application 132, executing on one or more user system(s) 130 and potentially using a local database 134, may interact with a server application 112 executing on platform 110 to execute one or more or a portion of one or more of the various functions, processes, methods, and/or software modules described herein. In an embodiment, client application 132 may utilize a local database 134 for storing data locally on user system 130. Client application 132 may be "thin," in which case processing is primarily carried out server-side by server application 112 on platform 110. A basic example of a thin client application 132 is a browser application, which simply requests, receives, and renders webpages at user system(s) 130, while server application 112 on platform 110 is responsible for generating the webpages and managing database functions. Alternatively, the client application may be "thick," in which case processing is primarily carried out client-side by user system(s) 130. It should be understood that client application 132 may perform an amount of processing, relative to server application 112 on platform 110, at any point along this spectrum between "thin" and "thick," depending on the design goals of the particular implementation. In any case, the application described herein, which may wholly reside on either platform 110 (e.g., in which case server application 112 performs all processing) or user system(s) 130 (e.g., in which case client application 132 performs all processing) or be distributed between platform 110 and user system(s) 130 (e.g., in which case server application 112 and client application 132 both perform processing), can comprise one or more executable software modules comprising instructions that implement one or more of the processes, methods, or functions of the application described herein.

Figure 2:
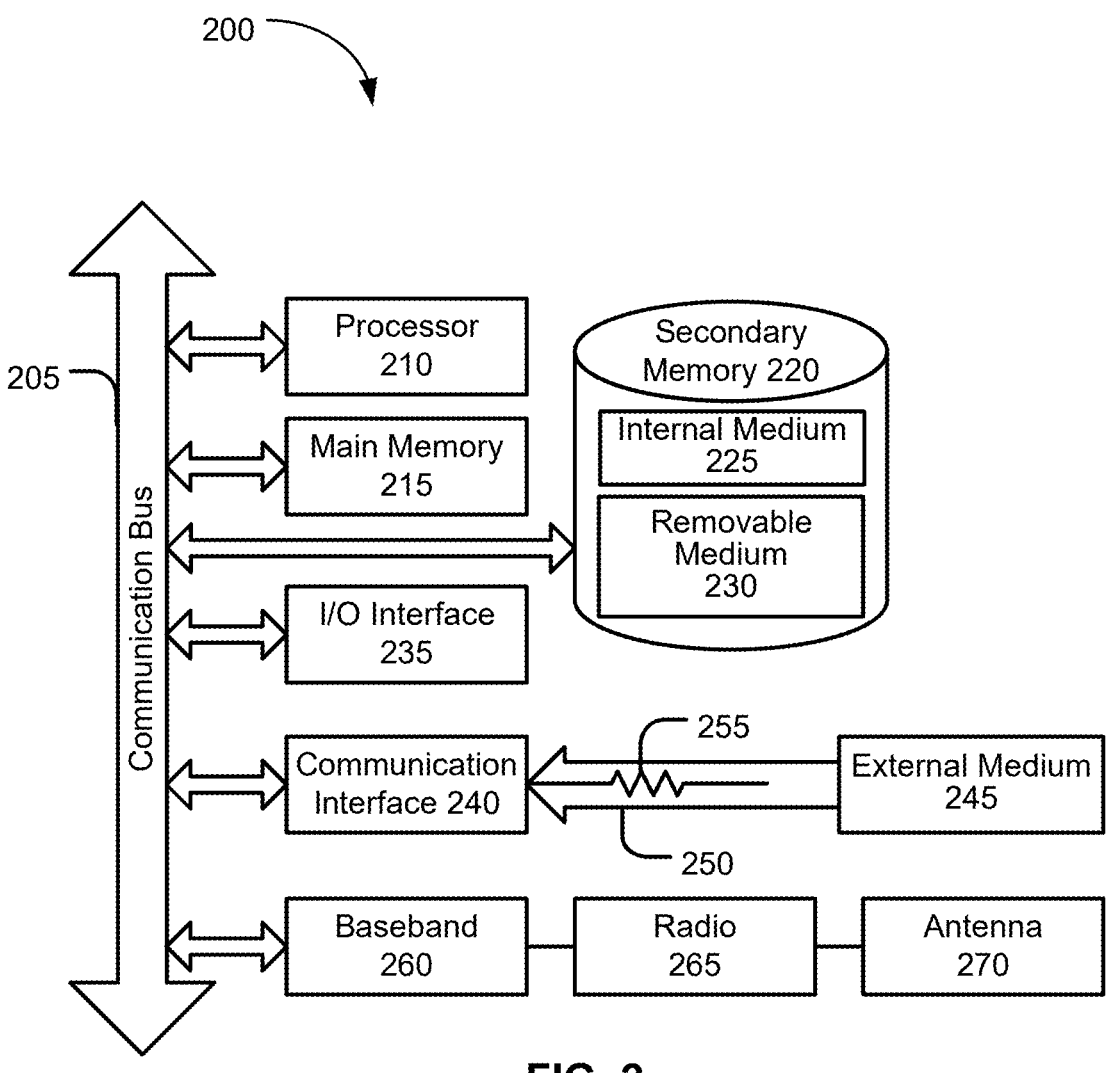
FIG. 2 illustrates an example processing system, by which one or more of the processes described herein, may be executed, according to an embodiment.

FIG. 2 is a block diagram illustrating an example wired or wireless system 200 that may be used in connection with various embodiments described herein. For example, system

200 may be used as or in conjunction with one or more of the functions, processes, or methods (e.g., to store and/or execute the application or one or more software modules of the application) described herein, and may represent components of platform 110, user system(s) 130, external system(s) 140, and/or other processing devices described herein. System 200 can be a server or any conventional personal computer, or any other processor-enabled device that is capable of wired or wireless data communication. Other computer systems and/or architectures may be also used, as will be clear to those skilled in the art.

System 200 preferably includes one or more processors 210. Processor(s) 210 may comprise a central processing unit (CPU). Additional processors may be provided, such as a graphics processing unit (GPU), an auxiliary processor to manage input/output, an auxiliary processor to perform floating-point mathematical operations, a special-purpose microprocessor having an architecture suitable for fast execution of signal-processing algorithms (e.g., digital-signal processor), a slave processor subordinate to the main processing system (e.g., back-end processor), an additional microprocessor or controller for dual or multiple processor systems, and/or a coprocessor. Such auxiliary processors may be discrete processors or may be integrated with processor 210. Examples of processors which may be used with system 200 include, without limitation, the Pentium® processor, Core i7® processor, and Xeon® processor, all of which are available from Intel Corporation of Santa Clara, California.

Processor 210 is preferably connected to a communication bus 205. Communication bus 205 may include a data channel for facilitating information transfer between storage and other peripheral components of system 200. Furthermore, communication bus 205 may provide a set of signals used for communication with processor 210, including a data bus, address bus, and/or control bus (not shown). Communication bus 205 may comprise any standard or non-standard bus architecture such as, for example, bus architectures compliant with industry standard architecture (ISA), extended industry standard architecture (EISA), Micro Channel Architecture (MCA), peripheral component interconnect (PCI) local bus, standards promulgated by the Institute of Electrical and Electronics Engineers (IEEE) including IEEE 488 general-purpose interface bus (GPIB), IEEE 696/S-100, and/or the like.

System 200 preferably includes a main memory 215 and may also include a secondary memory 220. Main memory 215 provides storage of instructions and data for programs executing on processor 210, such as one or more of the functions and/or modules discussed herein. It should be understood that programs stored in the memory and executed by processor 210 may be written and/or compiled according to any suitable language, including without limitation C, C#, C++, Java, JavaScript, Perl, Visual Basic, .NET, and the like. Main memory 215 is typically semiconductor-based memory such as dynamic random access memory (DRAM) and/or static random access memory (SRAM). Other semiconductor-based memory types include, for example, synchronous dynamic random access memory (SDRAM), Rambus dynamic random access memory (RDRAM), ferroelectric random access memory (FRAM), and the like, including read only memory (ROM).

Secondary memory 220 may optionally include an internal medium 225 and/or a removable medium 230. Removable medium 230 is read from and/or written to in any well-known manner. Removable storage medium 230 may be, for example, a magnetic tape drive, a compact disc (CD)

drive, a digital versatile disc (DVD) drive, other optical drive, a flash memory drive, and/or the like.

Secondary memory 220 is a non-transitory computer-readable medium having computer-executable code (e.g., disclosed software modules) and/or other data stored thereon. The computer software or data stored on secondary memory 220 is read into main memory 215 for execution by processor 210.

In alternative embodiments, secondary memory 220 may include other similar means for allowing computer programs or other data or instructions to be loaded into system 200. Such means may include, for example, a communication interface 240, which allows software and data to be transferred from external storage medium 245 to system 200. Examples of external storage medium 245 may include an external hard disk drive, an external optical drive, an external magneto-optical drive, and/or the like. Other examples of secondary memory 220 may include semiconductor-based memory, such as programmable read-only memory (PROM), erasable programmable read-only memory (EPROM), electrically erasable read-only memory (EE-PROM), and flash memory (block-oriented memory similar to EEPROM).

As mentioned above, system 200 may include a communication interface 240. Communication interface 240 allows software and data to be transferred between system 200 and external devices (e.g. printers), networks, or other information sources. For example, computer software or executable code may be transferred to system 200 from a network server (e.g., platform 110) via communication interface 240. Examples of communication interface 240 include a built-in network adapter, network interface card (NIC), Personal Computer Memory Card International Association (PCM-CIA) network card, card bus network adapter, wireless network adapter, Universal Serial Bus (USB) network adapter, modem, a wireless data card, a communications port, an infrared interface, an IEEE 1394 fire-wire, and any other device capable of interfacing system 200 with a network (e.g., network(s) 120) or another computing device. Communication interface 240 preferably implements industry-promulgated protocol standards, such as Ethernet IEEE 802 standards, Fiber Channel, digital subscriber line (DSL), asynchronous digital subscriber line (ADSL), frame relay, asynchronous transfer mode (ATM), integrated digital services network (ISDN), personal communications services (PCS), transmission control protocol/Internet protocol (TCP/IP), serial line Internet protocol/point to point protocol (SLIP/PPP), and so on, but may also implement customized or non-standard interface protocols as well.

Software and data transferred via communication interface 240 are generally in the form of electrical communication signals 255. These signals 255 may be provided to communication interface 240 via a communication channel 250. In an embodiment, communication channel 250 may be a wired or wireless network (e.g., network(s) 120), or any variety of other communication links. Communication channel 250 carries signals 255 and can be implemented using a variety of wired or wireless communication means including wire or cable, fiber optics, conventional phone line, cellular phone link, wireless data communication link, radio frequency ("RF") link, or infrared link, just to name a few.

Computer-executable code (e.g., computer programs, such as the disclosed application, or software modules) is stored in main memory 215 and/or secondary memory 220. Computer programs can also be received via communication interface 240 and stored in main memory 215 and/or secondary memory 220. Such computer programs, when executed, enable system 200 to perform the various functions of the disclosed embodiments as described elsewhere herein.

In this description, the term "computer-readable medium" is used to refer to any non-transitory computer-readable storage media used to provide computer-executable code and/or other data to or within system 200. Examples of such media include main memory 215, secondary memory 220 (including internal memory 225, removable medium 230, and external storage medium 245), and any peripheral device communicatively coupled with communication interface 240 (including a network information server or other network device). These non-transitory computer-readable media are means for providing executable code, programming instructions, software, and/or other data to system 200.

In an embodiment that is implemented using software, the software may be stored on a computer-readable medium and loaded into system 200 by way of removable medium 230, I/O interface 235, or communication interface 240. In such an embodiment, the software is loaded into system 200 in the form of electrical communication signals 255. The software, when executed by processor 210, preferably causes processor 210 to perform one or more of the processes and functions described elsewhere herein.

In an embodiment, I/O interface 235 provides an interface between one or more components of system 200 and one or more input and/or output devices. Example input devices include, without limitation, sensors, keyboards, touch screens or other touch-sensitive devices, cameras, biometric sensing devices, computer mice, trackballs, pen-based pointing devices, and/or the like. Examples of output devices include, without limitation, other processing devices, cathode ray tubes (CRTs), plasma displays, light-emitting diode (LED) displays, liquid crystal displays (LCDs), printers, vacuum fluorescent displays (VFDs), surface-conduction electron-emitter displays (SEDs), field emission displays (FEDs), and/or the like. In some cases, an input and output device may be combined, such as in the case of a touch panel display (e.g., in a smartphone, tablet, or other mobile device).

System 200 may also include optional wireless communication components that facilitate wireless communication over a voice network and/or a data network (e.g., in the case of user system 130). The wireless communication components comprise an antenna system 270, a radio system 265, and a baseband system 260. In system 200, radio frequency (RF) signals are transmitted and received over the air by antenna system 270 under the management of radio system 265.

In an embodiment, antenna system 270 may comprise one or more antennae and one or more multiplexors (not shown) that perform a switching function to provide antenna system 270 with transmit and receive signal paths. In the receive path, received RF signals can be coupled from a multiplexor to a low noise amplifier (not shown) that amplifies the received RF signal and sends the amplified signal to radio system 265.

In an alternative embodiment, radio system 265 may comprise one or more radios that are configured to communicate over various frequencies. In an embodiment, radio system 265 may combine a demodulator (not shown) and modulator (not shown) in one integrated circuit (IC). The demodulator and modulator can also be separate components. In the incoming path, the demodulator strips away the RF carrier signal leaving a baseband receive audio signal, which is sent from radio system 265 to baseband system 260.

If the received signal contains audio information, then baseband system 260 decodes the signal and converts it to an analog signal. Then the signal is amplified and sent to a speaker. Baseband system 260 also receives analog audio signals from a microphone. These analog audio signals are converted to digital signals and encoded by baseband system 260. Baseband system 260 also encodes the digital signals for transmission and generates a baseband transmit audio signal that is routed to the modulator portion of radio system 265. The modulator mixes the baseband transmit audio signal with an RF carrier signal, generating an RF transmit signal that is routed to antenna system 270 and may pass through a power amplifier (not shown). The power amplifier amplifies the RF transmit signal and routes it to antenna system 270, where the signal is switched to the antenna port for transmission.

Baseband system 260 is also communicatively coupled with processor(s) 210. Processor(s) 210 may have access to data storage areas 215 and 220. Processor(s) 210 are preferably configured to execute instructions (i.e., computer programs, such as the disclosed application, or software modules) that can be stored in main memory 215 or secondary memory 220. Computer programs can also be received from baseband processor 260 and stored in main memory 210 or in secondary memory 220, or executed upon receipt. Such computer programs, when executed, enable system 200 to perform the various functions of the disclosed embodiments.

Embodiments of processes for automated determination of building code performance will now be described in detail. It should be understood that the described processes may be embodied in one or more software modules that are executed by one or more hardware processors (e.g., processor 210), for example, as the application discussed herein (e.g., server application 112, client application 132, and/or a distributed application comprising both server application 112 and client application 132), which may be executed wholly by processor(s) of platform 110, wholly by processor(s) of user system(s) 130, or may be distributed across platform 110 and user system(s) 130, such that some portions or modules of the application are executed by platform 110 and other portions or modules of the application are executed by user system(s) 130. The described processes may be implemented as instructions represented in source code, object code, and/or machine code. These instructions may be executed directly by hardware processor(s) 210, or alternatively, may be executed by a virtual machine operating between the object code and hardware processors 210. In addition, the disclosed application may be built upon or interfaced with one or more existing systems.

Alternatively, the described processes may be implemented as a hardware component (e.g., general-purpose processor, integrated circuit (IC), application-specific integrated circuit (ASIC), digital signal processor (DSP), field-programmable gate array (FPGA) or other programmable logic device, discrete gate or transistor logic, etc.), combination of hardware components, or combination of hardware and software components. To clearly illustrate the interchangeability of hardware and software, various illustrative components, blocks, modules, circuits, and steps are described herein generally in terms of their functionality. Whether such functionality is implemented as hardware or software depends upon the particular application and design constraints imposed on the overall system. Skilled persons can implement the described functionality in varying ways for each particular application, but such implementation decisions should not be interpreted as causing a departure from the scope of the claims included herein. In addition, the grouping of functions within a component, block, module, circuit, or step is for ease of description. Specific functions or steps can be moved from one component, block, module, circuit, or step to another.

Furthermore, while the processes, described herein, are illustrated with a certain arrangement and ordering of sub-processes, each process may be implemented with fewer, more, or different subprocesses and a different arrangement and/or ordering of subprocesses. In addition, it should be understood that any subprocess, which does not depend on the completion of another subprocess, may be executed before, after, or in parallel with that other independent subprocess, even if the subprocesses are described or illustrated in a particular order.

As discussed, building permit review is the process of evaluating a proposed building design against its building codes, ordinances and regulations to verify compliance and identify issues before construction takes place. Typically, counties and/or cities of the United States have one or more departments established to oversee building construction, where one can submit building documents, such as an application for a building permit.

Figure 3:
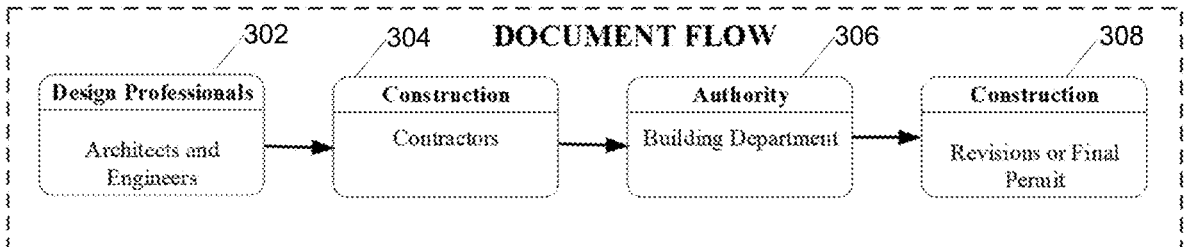
FIG. 3 shows a document flow in a conventional building permit process.

Referring to FIG. 3, a flow for a conventional Design Review Process (DRP) is shown, where design professionals (such as architects and engineers) and construction professionals (such as contractors) can be consulted, in steps 302 and 304, to prepare documents related to a building permit application for a building project. Accordingly, the application can be submitted to the applicable government authority to be reviewed, revised if necessary, and approved to result in issuance of a building permit before construction can commence on the building project.

Accordingly, the appropriate government authority or department will manually review the building documents, in step 306, to determine if they comply with the appropriate building code sections. The building documents can often be submitted as PDF (Portable Document Format) forms (e.g., the building drawings including the plans, sections, elevations, and all construction details are generated using a computer-aided design (CAD) program), but the review, step 308, of the forms has not changed significantly from when hardcopies forms were submitted in prior years.

Accordingly, the manual building design review process (DRP) is time-consuming, error-prone, subjective, and becoming very costly to sustain. Reasons behind these issues include: (a) increase rate of updates of regulations and standards with new knowledge and research outcomes; (b) new, state of the art technologies, equipment, and devices; and (c) a higher amount of data and its multidisciplinary nature (Nawari, 2012a; Nawari and Alsaffar, 2017 and 2017;). Moreover, for building designs, other issues associated with the manual DRP are lack of consistency in interpretation of regulatory provisions, the ability to properly self-check required aspects, and the long time needed for approvals of construction permits by building authorities that can have adverse financial impacts on projects submitted for authorization. Additionally, building codes and regulations are legal documents written and authorized by people to be understood and applied by professionals. As such, building codes and regulations are not precise as formal logic. Thus, the automation of a Design Review Process (DRP) is a challenge for the construction industry.

In accordance with embodiments of the present disclosure, exemplary systems and methods for automated determination of building code performance are provided to facilitate automation of the Design Review Process. The systems and methods described use a new system for a standard computable representation of building codes that are compatible with open data standard. Previously existing approaches for automated rules compliance verification in building design are either based on proprietary frameworks, domain-specific areas, or hard-coded rule-based expressions. While these approaches may be useful in their specific implementations, they have the disadvantages of being costly to sustain, difficult to modify, and the absence of a generalized framework of rules and regulations modeling that can adjust to different domains-thus, they are not compatible with an open data standard. Furthermore, the existing approaches do not have the means to deal with subjective and ambiguous building regulations, and they have not endured the test of industry applications.

An exemplary method for automated determination of building code compliance can automate a building construction permit process by having applicants upload their building permit application file, e.g., as represented in a Building Information Model (BIM; such as Autodesk Revit files or CAD (such as Autodesk DWG or DXF files) or PDF data or Industry Foundation Classes (IFC) file/data, to a platform, such as platform 110, which can be configured to compare the building permit application file information contained in the uploaded file to the local, state, national or international codes, ordinances and regulations. The results of the comparison, and any issue flagged can then be presented as output, e.g., to user system 130. Further, the comparison results can be used to preliminarily approve the permit and/or enable the government staff to improve the code requirements for the future. In fact, the BIM, CAD, IFC or PDF files and/or the results can be sent to the government authority, which can be one of the external systems 140.

In order to perform the comparison, the codes, ordinances and regulations must undergo an interpretation process where the semantic structure of each regulation is translated into object rules or parametric models, using certain formal languages, and associated with the building permit application file data being examined. This data can then be compared to the rules and models, or stated another way the rules and model can be applied to the data, and deficiencies noted. In a non-limiting example, the BIM model defines objects as parameters and relations to other objects and carries object attributes that specify pertinent details about the objects. For example, the BIM data can include spatial relationships of the building design, quantities and properties of building components, and a wide range of building details including architectural, structural, Mechanical, Electrical, Plumbing & Fire (MEPF), and other engineering systems and design information that can be checked against applicable codes and regulations. Automated determination of building code performance can include a variety of regulations, such as site zoning & development, utilities, infrastructure, etc.

In accordance with various embodiments of the present disclosure, an exemplary framework for automated determination of building code performance has at least two main phases. The first phase develops the theoretical background for transforming the written provisions and guidelines of applicable building codes and regulations into a computable representation. Accordingly, the first phase involves an interpretation process where the semantic structure of each regulation is translated into object rules or parametric models using certain formal languages. The first phase can be implemented on platform 110, and/or on another platform such as external system 140 and uploaded or transferred to platform 110.

The second phase specifies the various components required for the computerization of the code compliance checking process. Additional phases are focused on developing code for the data exchanges between the elements of the framework to perform the computerized evaluation process of building design to achieve compliance.

Figure 4:
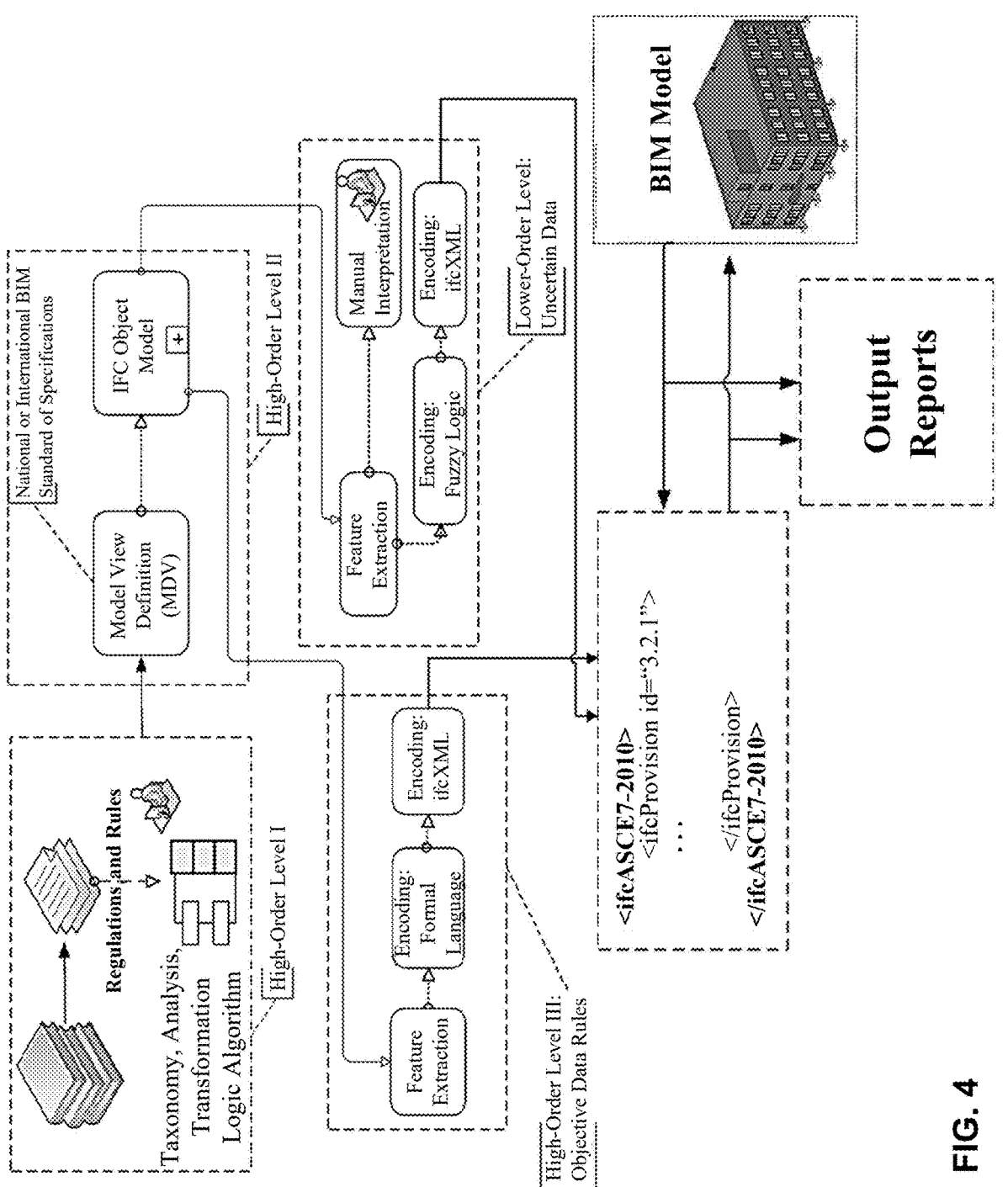
FIG. 4 shows an exemplary generalized adaptive framework for automated determination of building code performance in accordance with various embodiments of the present disclosure.

In particular, the second phase centers on development levels for the computable code. In various embodiments, the development levels include:

(i) High-Order Level I: Classification of regulatory text into four main categories: conditional; content; ambiguous; and dependent;

(ii) High-Order Level II: Requires the Development of Model View Definition (MVD), leading to IFC (Industrial Foundation Classes) schema;

(iii) Higher-order level III: Requires feature extraction of all specific objective data leading to full encoding of object rules/models; and (iv) Lower-order level: Necessitates feature extraction of uncertain data, then employing partial encoding using fuzzy logic and approximate reasoning methods as well as neural Natural Language Processing (NLP) techniques, deep neural network-style machine learning/Artificial Intelligence, as represented in an exemplary Generalized Adaptive Framework (GAF) for Automated Buildings Design Review of FIG. 4.

Figure 5:
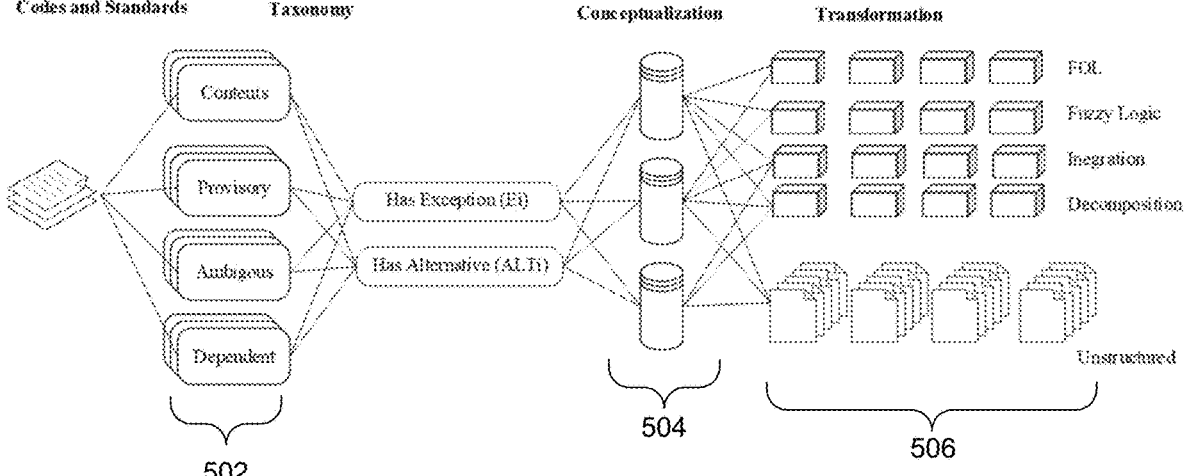
FIG. 5 shows an overview of the Transformation Logic Algorithm (TLA) in accordance with various embodiments of the present disclosure.

High-Order Level I involves taxonomy formation, data analysis including partitioning and classification of regulatory text into broad categories (e.g. content; conditional or provisory; ambiguous; dependent), and the development of Transformation Logic Algorithm (TLA). Accordingly, FIG. 5 shows an overview of the high-order level I phase. A first stage of the process of FIG. 5 involves the classification, in step 502, of building codes and standards into a taxonomy category. In the example of FIG. 5, there are 4 categories: concepts, provisory, ambiguous, and dependent. The taxonomy categories can then be conceptualized in step 504, and transformed into a logical rule based on the selected category in step 506. An exemplary system uses neural NLP techniques and/or deep neural network-style machine learning/Artificial Intelligence.

The TLA is based partially on first-order logic calculus. For example, the building code provision that says, "only Professional Engineer (PE) must approve structural design" can be stated as following using TLA:

$$\text{Prov}(PE) \in \text{Conditional}; \ \forall x(PE(x) \rightarrow \text{Permitted } (x, \text{approve design}))$$

$$\forall x(\neg PE(x) \forall x \neg \text{Permitted } (x, \text{approve design})).$$

Additional illustrative TLA examples (Nawari, 2012) are shown below:

(i) An object is a member of a category: $4{\times}8 \ S4S \in$ Wood Beams;

(ii) A category is a subclass of another category: Wood Beams $\subset$ Beams (iii) All members of a category have some properties: $x \in$ Wood Beams$\rightarrow$Rectangular (x).

Members of a category can be recognized by some properties:

$$\textit{DouglasFir}(x) \wedge \text{Square}(x) \wedge \text{Side}(x) =$$

$$9.25'' \wedge x \in \text{Beams } \rightarrow x \in \text{Wood Beams}.$$

The syntax used in the above statements has similar definitions as in first-order logic calculus. The definitions of the syntax used are summarized in Table 1 (Syntax of Transformation Logic Algorithm (TLA)) (below).

TABLE 1

| SYMBOL | DEFINITION |
| --- | --- |
| $::=$ | Is defined as |
| $\wedge$ | Conjunction |
| $\vee$ | Disjunction |
| $\subset$ | Subset of |
| $\neg$ | Negation |
| $\forall$ | Universal Quantifier |
| $\exists$ | Existential Quantifier |
| $\in$ | Belongs to |
| $\rightarrow$ | Implication |
| $\leftrightarrow$ | Biconditional |
| $\Rightarrow$ | Transform into |
| $::\Rightarrow$ | Depends upon |
| Constant | String starting with an uppercase letter |
| Variable | String starting with a lowercase letter |
| Pred (arg1, arg2, . . . ) | Predicate |
| Fun (arg1, arg2, . . . ) | Function |
| Pred(arg1, arg2, . . . ) $\wedge$ Pred2(arg1, arg2) $\vee$ . . . | Rule |

This TLA algorithm can be illustrated further by considering Florida Building Code—Residential 2020 (FBC 2020). FIG. 6 depicts parts of section 304 from the FBC 2020-Residential.

The provision shown in FIG. 6 can be transformed into computable representation using the TRA as follows:

Let $\text{REG}_i$="Section R304"; Where i varies from 1 to n number of code provisions. Then we have $$\text{REG}_i \in P_i \Rightarrow Y_i \Rightarrow X_i, \tag{1}$$

Where the subscript i stands for the counts of the code sections being processed and varies from 1 to n sections;

$P_i$ designates that this is a provisory clause, and describes the minimum room area ($Y_i$) which is given by $X_i$ that expresses the various Rules describing $Y_i$:

$$X_i = \{R_1, R_2, \ldots R_m\}, \tag{2}$$

Where $R_1, R_2, \ldots R_m$ are the rules defining $X_i$;

$$\text{Let } Z_{1j} = \{z_{11} \ldots z_{1q}\}; \tag{3}$$

$$z = \text{IfcSpace}; \ z_{11} = "R304.1"; \text{ and } z_{12} ::= \text{Floor area} \geq 70 \ \text{ft}^2 (6.5 \ \text{m}^2); \tag{4}$$

$$R_2 \ \forall \ z(\text{REG}_i(z) \rightarrow \text{MinimumArea}(z, \ z_{1j}) \wedge \neg \text{SpaceName}(z, \text{KITCHEN};) \tag{5}$$

$$Z_{2j} = \{z_{21} \ldots z_{2q}\}; \tag{6}$$

Where $Z_{21}$="R304.2"; and $z_{22} ::=$ least horizontal dimension of any habitable room$\geq 7$ ft (2.134 m);

$$R_3 \ \forall \ z(\text{REG}_i \ (z) \rightarrow \text{MinimumDimension}(z, Z_{2j}) \wedge \triangle \text{SpaceName}(z, \text{KITCHEN}); \tag{7}$$

$$Z_{3j} = \{z_{31} \ldots z_{3q}\}; \tag{8}$$

Where $Z_{31}$="R304.3"; $z_{32} ::=$Ceiling height>5 ft for sloped ceiling; and $z_{33} ::=$Ceiling height>7 ft for furred ceiling;

$$R_4 \ \forall \ z(\text{REG}_i(z) \rightarrow \text{CeilingHeightLimitation}(z, Z_{3j}); \text{ and} \tag{9}$$

$$X_i = \{R_1 \wedge R_2 \wedge R_3 \wedge R_4\}. \tag{10}$$

Equation 10 then represents the knowledge transformation process to generate computable model for the code specifications expressed in FBC 2020-Residential, section R304. Thus, all of the rules and regulations can be similarly translated into equations using the TLA. Again, this can be done on platform 110 or the equations can be uploaded thereto, depending on the embodiment.

Conditional clauses, such as above can be transformed directly from the textual format into set of rules. Examples of these are very common and typical features include rules with specific values. For example, provision (3.2.1) for computing lateral pressure in the ASCE 7-10 Standard for minimum design loads for buildings and other structure. Contents clauses cannot be translated into a TRUE or FALSE statement. Instead of advising, these clauses are usually used for definitions, such as the definition of firewall, fire rate, smoke evacuation, high-rise building, etc. Ambiguous clauses are the subjective provisions. They normally include words such as: approximately, about, relatively, close to, far from, maybe, etc. An example is the footnote of the design lateral soil pressure for the clause given in provision (3.2.1), ASCE 7-10: "For relatively rigid walls, as when braced by floors, the design lateral soil load shall be increased for sand and gravel type soils to 60 psf (9.43 kN/m2) per foot (meter) of depth. Basement walls extending not more than 8 ft (2.44 m) below grade and supporting light floor systems are not considered as being relatively rigid walls." Dependent clauses indicate that one clause is dependent upon one or more other clauses. They represent deep hierarchies and massive cross-referencing among provisions in code regulations. This means some provisions are only suitable for a particular condition when other clauses are met. These are often difficult to convert into sets of rules and may require manual verification for compliance.

Figure 7:
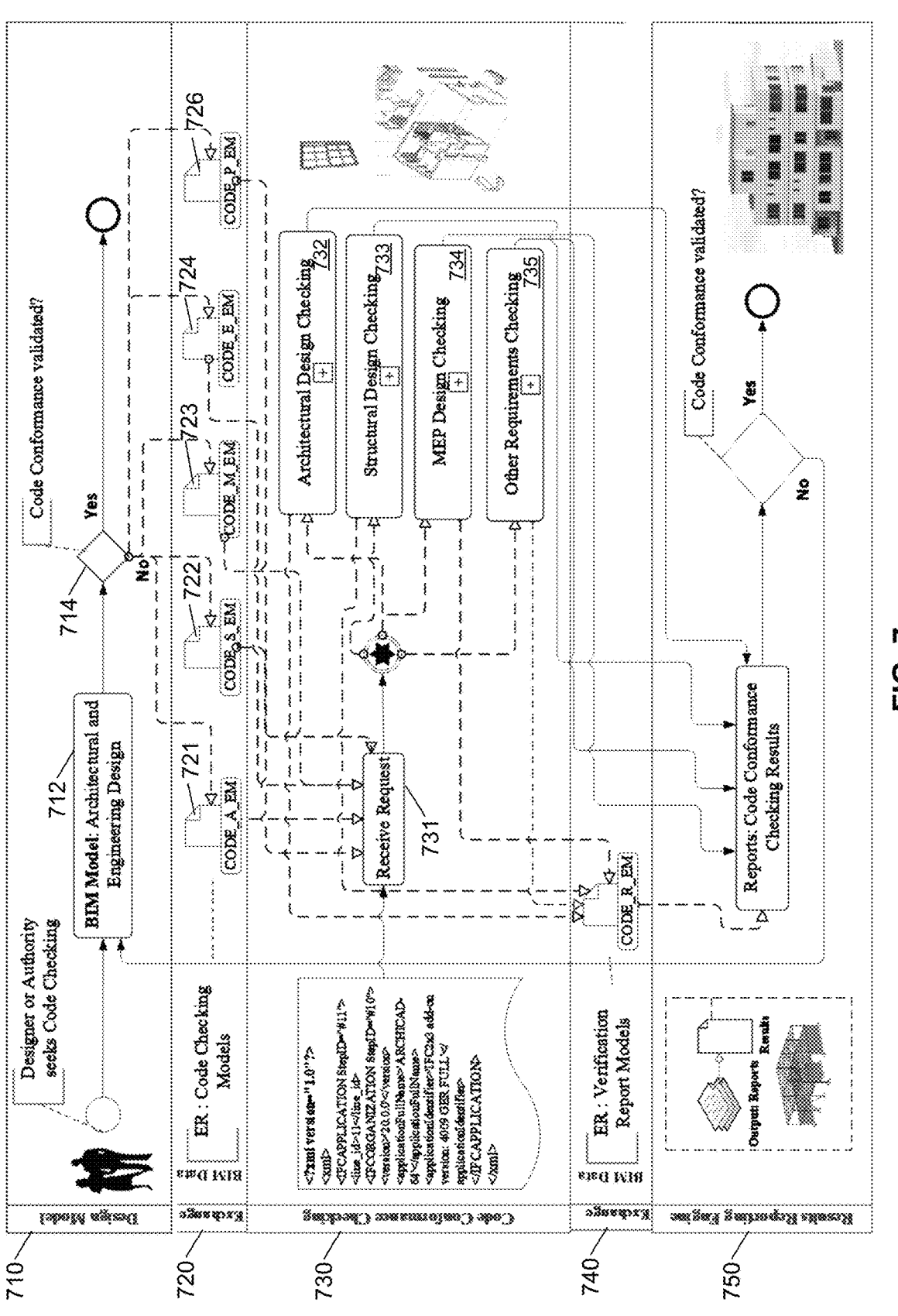
FIG. 7 shows an exemplary process for automated determination of building code performance in accordance with various embodiments of the present disclosure.

Referring back to FIG. 4, the higher-Order Level II phase of the exemplary GAF centers on the development of IDM (Information Delivery Manual) and MVD (Model View Definitions) that allows the building permit application file data to be compared to the relevant codes and regulations. The development of IDM for building code specifications starts with a description of data exchange functional requirements and workflow situations for interactions between building permit application file data (e.g., BIM model data) and the conditions specified in building codes. This is demonstrated in the process map of FIG. 7. An exemplary system uses neural NLP techniques and/or deep neural network-style machine learning/Artificial Intelligence.

The process map is generated using a standard Business Process Modeling Notation (BPMN) as part of the IDM specifications (Nawari and Kuenstle, 2018) to define the MVDs and how to exchange data related to the MVDs. In the process map depicted in FIG. 7, the following tasks and processes are identified: Design model validation 710, exchange code checking 720, code conformance checking 730, verification reporting 740, and results reporting 750. The main tasks can have various sub-processes that can also be defined using process maps and IDMs.

For example, the design model validation 710 task comprises entering BIM model information in step 712, which is then checked against the relevant codes and regulations, using the taxonomy described above, for conformance in step 714. If the BIM model is validated in step 714, then such can be reported, in task 750. But if the code is not initially validated, then the process can move to the exchange code checking task 720. Task 720 can comprise several code checking models. The IDM employs notation for information exchanges between activities called Exchange Models (EM). Each exchange model is distinctively recognized across all use cases. The EMs can include, e.g., CODE_A_EM: Building Code Regulations and Architectural Design use case exchange model(s) (721); CODE_S_EM: Building Code Regulations and Structural Design use case exchange model(s) (722); CODE_M_EM: Building Code Regulations and Mechanical System Design use case exchange model(s) (723); CODE_E_EM: Building Code Regulations and Electrical Design use case exchange models (724); CODE_P_EM: Building Code Regulations and Plumbing Design use case exchange model(s) (725); Building Code Regulations and Fire Protection Design use case exchange models (not shown), and CODE_R_EM: Building Code Regulations and Results Reporting use case exchange model(s) (726).

The Code Conformance Checking task 730 for architectural design process can involve receiving a request from the exchange models (EMs) in step 731 and then pass the BIM data to code checking modules, which can include the architectural design checking module 732, structural design checking module 733, MEP design checking module 734, and module 735 that can check for any other requirements, such as fire protection. These modules can, e.g., check for allowable building areas and heights, check for means for egress, verify accessibility, verify roofs and roof assemblies, check for requirements for elevators and conveying systems, check for detailed use and occupancy requirements, etc. Outputs of the respective design checking modules can be supplied as inputs to a verification report model 740 for compiling such that this information can be supplied as input to a results reporting engine 750. The results reporting engine 750 can output a report that is provided to a user system 130 and/or an external system 140. For example, the results or findings of the review (e.g., any issue flagged) can be presented as output, e.g., to user system 130. Further, the results can be used to preliminarily approve the permit, e.g., the results will have to be briefly reviewed by a government staff, and the results can be sent and reported to the government authority, which can be one of the external systems 140.

In each of these processes, the BIM or CAD or IFC or PDF requirements have to be established and stated according to the BIM or CAD of IFC or PDF standard procedure. In order to develop the IDM, the source regulation information needs to be classified. In one embodiment, Florida Building Code (FBC 2020) is considered as the source example for an implementation of the exemplary framework, as illustrated in Table 2 (below). FBC is, typically, updated every 3 years.

TABLE 2

| Section | Classification | Concepts and Attributes | Dependencies |
|---|---|---|---|
| 501 | Content (Cont) | General Scope, Identification | |
| 502 | Content (Cont) | Definitions | |
| 503.1 | Dependent (Dep) | Building Height and Areas limits; Fire Walls. | Table 503; Section 602; Section 706 |
| 503.1.1 | Provisory (Prov) | Special Industrial Buildings; Unlimited Area; Unlimited Height. | |
| 503.1.2 | Dependent (Dep) | Buildings on the same Lot; | Table 503; Section 504 and Section 506. |
| 503.1.3 | Dependent (Dep) | Buildings of Type I Construction; Unlimited Area; Unlimited Height; | Section 504.2; Section 504.31.1; Section 504.3. |

TABLE 2-continued

| Section | Classification | Concepts and Attributes | Dependencies |
|---|---|---|---|
| 504.1 | Dependent (Dep) | Building Height Limits; Exceptions; Automatic Sprinkler System; Automatic Fire-extinguishing System; Public Ways or Yards. | Table 503; Section 504.2 and Section 504.3 |

The range of the exchange requisite is the exchange of information about architectural spaces and height. The framework example focuses on a data Exchange Requirement (ER) for the building code compliance checking between the BIM model and a code conformance auditing model. The ER model is described in Table 3 (Data Exchange Model Description: Building Code Regulations and Architectural Design) (below) and Table 4 (Part of Information Exchange Requirements for FBC 2020) using FBC 2020 (below). The purpose of the exchange model description is to record the extent and range of the exchange requirements, which defines an overview of the exchange requirements and is used as a general guide in the process of describing the Exchange Requirements Model.

TABLE 3

| Project Parameters | Data Definition |
|---|---|
| Type | Task |
| Name | CODE_A_EM |
| Version | 1.0 |
| Documentation | Designer or building authority use building codes specification to examine the compliance of the architectural model with specific code regulations. The building code used in this exchange model is Florida Building Code, 7$^{th}$ Edition, 2020 (FBC 2020), chapter 5. Exchange model objective is to provide feedback on allowable Building Heights and Areas. |

TABLE 4

| Type of information | Information needed | Required (Req) | Optional (Opt) | Req/ Opt | Data type | Units |
|---|---|---|---|---|---|---|
| Building Code Identifiers | Name | X | | | String | n/a |
| | Year | X | | | Date | n/a |
| | Version | X | | | String | n/a |
| | Section Number | X | | | Double | n/a |
| | Section Title | X | | | String | n/a |
| | Clause | X | | | String | n/a |
| Classification Attributes | Content (Cont) | | | X | String | n/a |
| | Provisory (Prov) | | | X | String | n/a |
| | Dependent (Dep) | | | X | String | n/a |
| | Ambiguous (Amb) | | | X | String | n/a |
| Regulation Attributes | Allowable Area | X | | | Double | ft²; m² |
| | Allowable Height | X | | | Double | ft; m |
| | Areas limits | X | | | Double | ft²; m² |
| | Occupancy Type | X | | | String | n/a |
| | Building Group | X | | | String | n/a |

TABLE 4-continued

| Type of information | Information needed | Required (Req) | Optional (Opt) | Req/ Opt | Data type | Units |
|---|---|---|---|---|---|---|
| | Building Area | X | | | Double | ft²; m² |
| | Building Height | X | | | Double | ft; m |
| | Building Perimeter | X | | | Double | ft; m |
| | Sprinklered Area | | X | | Yes/No | n/a |
| | Aggregate Area | | X | | Double | ft²; m² |
| | Unlimited Area | | X | | Yes/No | |
| | Equipment Platforms Area | | X | | Double | ft²; m² |
| | No. of Stories | X | | | Integer | n/a |
| | Fire Area | | X | | Double | ft²; m² |
| | Mezzanine | | X | | Yes/No | n/a |
| | Mezzanine Area | | X | | Double | ft²; m² |
| | Walk Ways Width | | X | | Double | ft; m |
| | Alternating Tread Devices | | X | | Yes/No | n/a |
| | Means of Egress | | X | | String | n/a |
| | Mixed Occupancy | | X | | Yes/No | n/a |
| | Reduced Open Space | | X | | Yes/No | n/a |
| | Liquid Storage Rooms | | X | | Yes/No | n/a |
| | Area of Motion Picture Theater | | X | | | |
| | Type of Construction | X | | | String | n/a |
| | Automatic Sprinkler System | | X | | Yes/No | n/a |
| | Area of Covered and Opened Mall Buildings | | X | | | |
| | Area of Anchor Buildings | | X | | | |
| | Liquid Use Room | | X | | String | |
| | Dispensing and Mixing Room | | X | | | |
| | Spray Paint Booths | | X | | Yes/No | n/a |
| | Control Area | X | | | Yes/No | n/a |
| | Fire Wall | | X | | Yes/No | n/a |
| | Doweling | | X | | Yes/No | n/a |
| | Exit Access | | X | | Yes/No | n/a |

The IFC schema encompasses a wide range of data objects, since the schema involves the whole lifecycle of a building and its environment. Thus, it is recommended that each discipline domain should only consider a subset of the full IFC schema to avoid processing an overwhelming amount of data. A Model View Definition (MVD) is developed as the tool for creating model subsets that are pertinent to the specific data exchange between domain application types. MVD diagram describes the concepts and attributes that will be used in the data exchange, as well as the schema and relationships between these concepts and attributes. In general, the exchange models are transformed from the IDM into various concepts. Each concept, in turn, is described with several attributes and relationships. For example, a "Type of Construction" concept may have attributes such as Type I-A, Type II-A, Type III-A, Type III-B, etc. Each of these attributes may have specific governing rules such as the structural frame, exterior walls, ceiling, and roof assembly. The concluding phase is the translation of the MVD into implementation IFC entities, attributes, relationships and properties as required by the IFC schema.

The process of developing the MVDs counts on the description of the information exchange models (EMs) in the IDM and how they will be utilized, both with respect to domain users and software developers. From this information, the MVD is established for each attribute and describes how it is to be handled in the IFC schema. In essence, MVD offers the specification for IFC based data exchange implementation.

In various embodiments, a MVD (Architectural Design to Building Regulations) can represent part of the exchanges for code checking (General Building Heights and Areas regulations of FBC 2020) and the architectural design. An exemplary MVD can provide the basis for developing MVD covering other parts of building regulations and standards, which will enable high-quality IFC implementations that satisfy a design review process.

The development of the MVDs and EMs allows for certain objective aspects of the codes and regulations of the extracted and encoded in the High-order Level III phase. The Lower Order Level phase of an exemplary GAF framework introduces the method of transforming (step 506) ambiguous provisions into rules by applying an algorithm for partial transformation using first order logic (FOL), fuzzy logic, integration, decomposition, and approximate reasoning methods. Fuzzy logic offers ways of modeling linguistic rules in such a format that they can be integrated into a coherent logical schema (Nawari, 2019).

An example of vague design regulations can be found in Florida Building Code 2020-Residential (FBC 2020-R) section R322.1 In this provision, the regulations states:

Buildings and structures constructed in whole or in part in flood hazard areas, including A or V Zones and Coastal A Zones, as established in Table R301.2(1), and substantial improvement and restoration of substantial damage of buildings and structures in flood hazard areas, shall be designed and constructed in accordance with the provisions contained in this section.

The word substantial is never defined precisely. Using an exemplary approach, then we have $$\text{REG}_1\text{="Section R322.1"; then we have } \text{REG}_1 \in (C_1 \cap A_1) \qquad (11)$$

Where $\text{REG}_1$ is a variable for the regulation section, $(C_1 \wedge A_1)$ designates that this is a content clause with ambiguous statements describing flood resistance construction. Now let $$\text{REG}_1 = \{R_1, R_2, \ldots R_m\} \qquad (12)$$

where, $R_1, R_2, \ldots R_m$ are the rules defining $\text{REG}_1$. Next let $$Z_{1j} = \{z_{11}, \ldots z_{1q}\}; \qquad (13)$$

$$z = IfcBuilding;$$

$$z_{11} = \text{"}FBC\,2020 - R322\text{";}$$

$$z_{12} = \text{"}ASCE\,24\text{".}$$

Now using logic notations, we have $$R_1 \,\forall\, z(\text{InFloodZone}(z) \rightarrow (\text{RequiredProvision}(z, z_{11}))); \qquad (14)$$

$$R_2 \,\forall\, z(\text{InFloodZone}(z) \rightarrow (\text{RequiredProvision}(z, z_{12}))). \qquad (15)$$

In terms of the conceptualization of the expression "substantial damage", fuzzy logic and predicates will be employed to translate the concepts into a computable model. A fuzzy set is defined as (Zadeh, 1965): A is a fuzzy subset of the universe of discourse U, is characterized by a membership function $\mu_A$: U→[0 . . . 1] which associates with each element u of U a number $\mu_A$ (u) in the interval [0, 1]. This description can be utilized to express fuzzy predicate (Nawari, 2018). The truth-value of any proposition can be estimated as the degree of membership of the corresponding fuzzy relation. Consequently, a fuzzy predicate can be described as the membership function of a fuzzy relation over individual variables' universe of discourse. Each fuzzy predicate signifies a concept in the GAF. For instance, the building damage described in section R322 of the FBC 2020-R can be modeled as a fuzzy variable. These involve small damage, medium damage, and substantial damage. Next, let $z_{i2}$=a fuzzy variable described as $$
\begin{aligned}
\mu_A(u) &= 0 & 80\% \le u \ge 0 \\
\mu_A(u) &= \left(\frac{1}{15}\right)u - \frac{25}{15} & 80\% < u \ge 90\% \\
\mu_A(u) &= 1 & u > 90\%
\end{aligned}
\right\} \qquad (16)
$$

where $0 < \mu_A(u) \le 1$.

Finally, section R322 of the FBC 2020-Residential is transformed into the following rule:

$$R_3 \,\forall\, z(\text{InFloodZone}(z) \cap \text{Damage}(z, z_{12}) \rightarrow (\text{RequiredProvision}(z, z_{11}))) \qquad (17)$$

Engineering design codes do have quite often such vague terms to describe certain design or construction conditions. Table 5 (Common ambiguous terms in building regulations) (below) summarizes some of these terms and their transformation using a fuzzy predicate.

TABLE 5

| No | Uncertain building code Terms | Conceptualization |
|---|---|---|
| 1 | The building has Some damage | Fuzzy predicate, $0 \le \mu_A(u) \le 1$ |
| 2 | The building has a good amount of damage | Fuzzy predicate, $0 \le \mu_A(u) \le 1$ |
| 3 | Building damage is extreme | Fuzzy predicate, $0 \le \mu_A(u) \le 1$ |
| 4 | A Substantial amount or a sizable amount | Fuzzy predicate, $0 \le \mu_A(u) \le 1$ |
| 5 | A fair amount or Moderate amount | Fuzzy predicate, $0 \le \mu_A(u) \le 1$ |
| 6 | Large value | Fuzzy predicate, $0 \le \mu_A(u) \le 1$ |
| 7 | Small amount | Fuzzy predicate, $0 \le \mu_A(u) \le 1$ |
| 8 | Very little or a little bit | Fuzzy predicate, $0 \le \mu_A(u) \le 1$ |

The fuzzy predicate may be defined as a relation with arguments, and the arguments may be constants or variable: Rel(u, A), where A is fuzzy set, Rel is a relation, and u is an element in the Universe of discourse U. For instance, "Building X damage is substantial." The fuzzy predicate is given by Damage(Building X, substantial) where "substantial" is fuzzy set, "Damage" is a relation and "Building X" is an individual element.

Figure 8A:
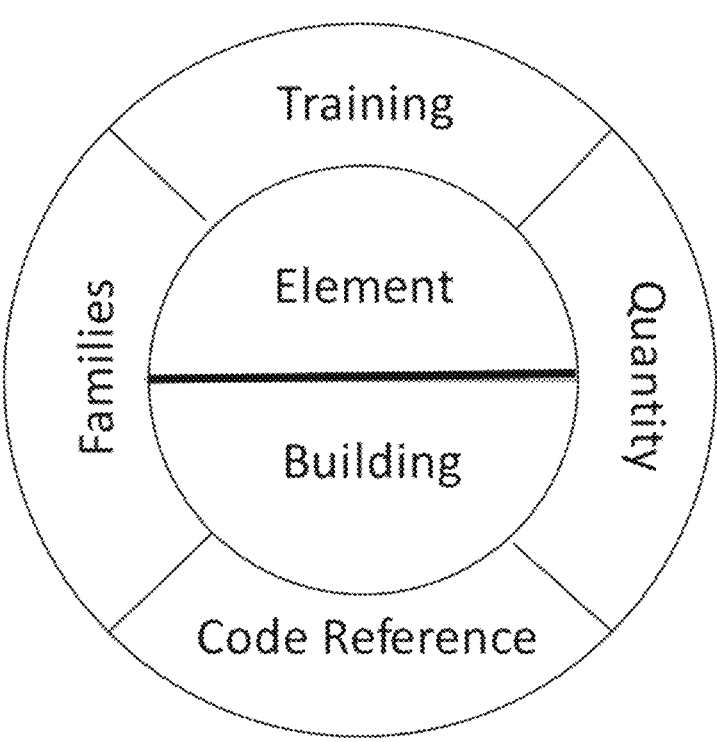
FIG. 8A shows an exemplary interface for framework software in accordance with embodiments of the present disclosure.

By integrating building permit applications and related documents with building information modeling concepts, exemplary methods and systems can be employed to evaluate and check for compliance with such documents with applicable building codes and regulations. Accordingly, in various embodiments, building codes and regulations can be transformed into equivalent logic rules by which an input file can be assessed using artificial intelligence and machine learning via one or more artificial neural networks. An exemplary system uses neural NLP techniques and/or deep neural network-style machine learning/Artificial Intelligence. In various embodiments, the framework software can be installed on a central server that can be made available to various local municipalities to provide code compliance review and related services for the building designs and related documents involving the municipalities and their constituents. In some embodiments, the framework software comprises a plug-in piece of software for an existing computer program. In some embodiments, the plug-in software installed as an external program (sometimes referred to as "addin") allows the user of the software program to (a) perform real time code checking and/or compliance of individual building elements or components as the building design model is being developed/modeled in the software platform; (b) perform real time code checking and/or compliance of a whole building as the building design model is being developed/modeled in the software platform; (c) perform a real time display of relevant codes for individual building elements or components as the building design model is being developed/modeled in the software platform; (d) perform a real time display of relevant codes for the whole building as the building design model is being developed/modeled in the software platform; and (e) perform a real time display of interactive training materials or building elements or components or the whole building as the building design model is being developed/modeled in the software platform. In some embodiments, the plug-in software shows a semi-transparent interface embedded with buttons for enabling the above listed actions, as illustrated in FIG. 8A. This interface is moveable (rotate, move, translate, scale) and can be pinned to the software program. In some embodiments, the plug-in software can run in the cloud-computing environment or in a desktop application. In accordance with the present disclosure, a building permit application file standard can be established for the development of building permit applications and computable records of building code regulations. As such, a rule-based system, implemented via an artificial intelligence system or neural network, can be established to automatically check building code conformance for architectural, structural, MEPF, and other regulations. In various embodiments, the neural network can output prediction confidence data for its compliance review and/or classification of building project details. Any inaccurate prediction of code conformance can be fed back to the AI system for improved prediction in the future. To do so, the neural network may use supervised or unsupervised or other learning methods to improve accuracy of building code conformance review of building projects.

Figure 8B:
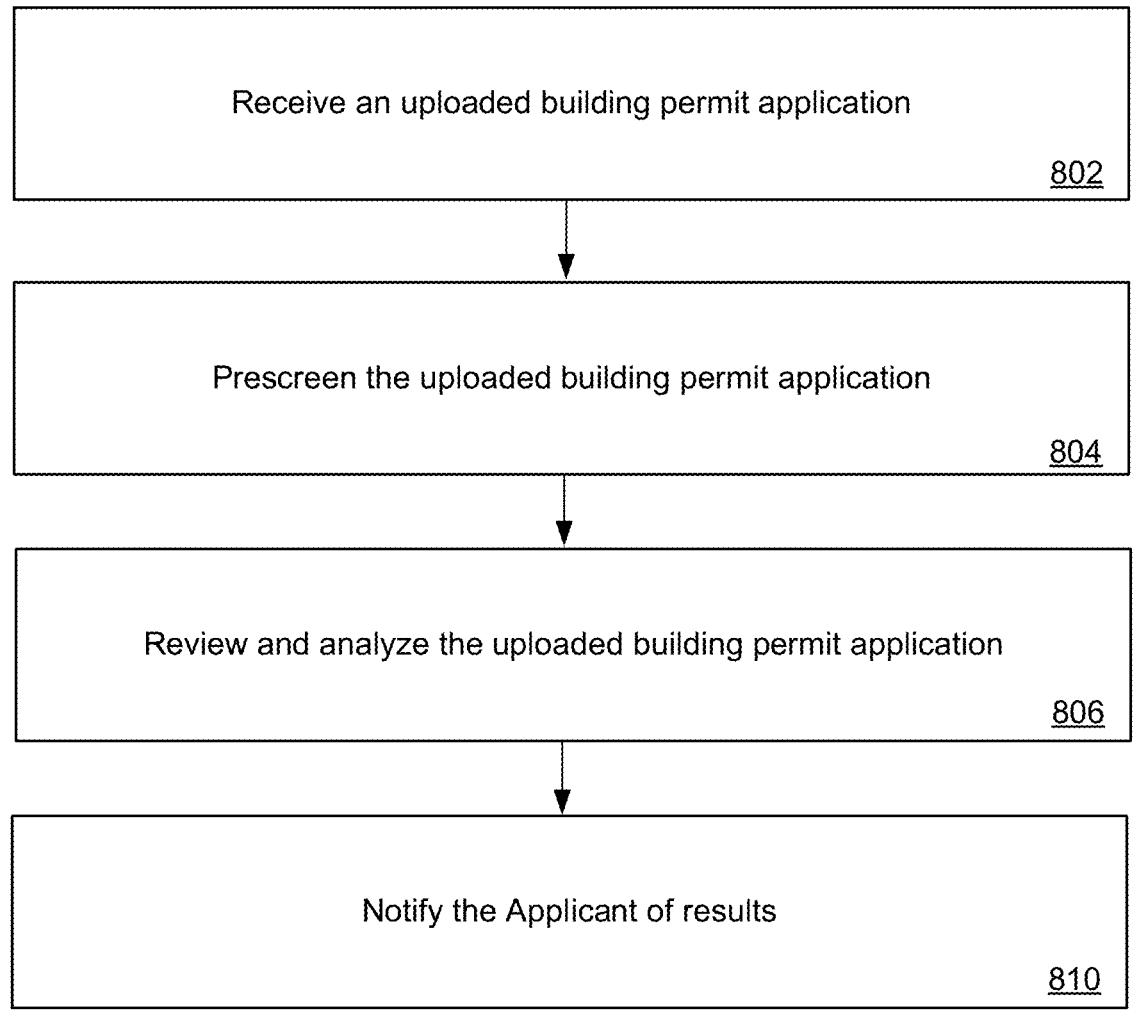
FIG. 8B shows a flowchart of an exemplary building plan review process in accordance with various embodiments of the present disclosure.

Next, FIG. 8B shows an exemplary building plan review process, in accordance with various embodiments of the present disclosure. To start this process, an Applicant can upload a building permit application, in step 802, which can be prescreened, in step 804, to verify that the application is in the correct format, contact information is provided for the Applicant, or to verify other information that does not require detailed analysis or expert analysis of the contents of the application file. After the prescreening review is approved and completed, then in step 806, the building permit application file can begin to be analyzed via an embodiment of an exemplary automated determination of building code performance framework of the present disclosure. As part of this analysis, a previously stored version of the building permit application file may be retrieved and compared against an updated version of the building application file. Upon completion of the review and analysis, the Applicant may be notified, in step 810, that corrections are required and additional information will need to be reviewed or the Applicant may be granted a building permit, in step 810, if corrections are not required, as depicted in the figure.

The present disclosure provides various systems and methods of automated determination of building code performance. One such method among others comprises receiving, by a computing device, a building permit application file for a construction project, wherein the building permit application file includes a BIM or CAD or IFC or PDF file of the construction project; checking, by the computing device, the building permit application file for building code conformance with computable files defining building codes; generating, by the computing device, a building code conformance report indicating whether the building permit application file has passed a check for the building code conformance; and transmitting, by the computing device, the building code conformance report to a client device of an applicant associated with the building permit application file.

As discussed, the present disclosure also provides systems of automated determination of building code performance. One such system comprises at least one processor; and memory configured to communicate with the at least one processor, wherein the memory stores instructions that, in response to execution by the at least one processor, cause the at least one processor to perform operations comprising: receiving a building permit application file for a construction project, wherein the building permit application file includes a BIM or CAD or IFC or PDF file of the construction project; checking the building permit application file for building code conformance with computable files defining building codes; generating a building code conformance report indicating whether the building permit application file has passed a check for the building code conformance; and transmitting the building code conformance report to a client device of an applicant associated with the building permit application file.

In one or more aspects, an exemplary system/method may further comprise acquiring architectural details of the construction project from the building information model of the construction project, wherein the checking for building code compliance comprises checking the architectural details of the construction project for conformance with architectural design rules as defined with the computable files; retrieving a stored building code conformance review report of the Applicant for the construction project; acquiring structural details of the construction project from the building information model of the construction project, wherein the checking for building code compliance comprises checking the structural details of the construction project for conformance with structural design rules as defined with the computable files; acquiring mechanical, electrical, & plumbing (MEPF) details of the construction project from the building information model of the construction project, wherein the checking for building code compliance comprises checking the MEPF details of the construction project for conformance with MEPF design rules as defined with the computable files; acquiring land use details of the construction project from the building information model of the construction project, wherein the checking for building code compliance comprises checking the land use details of the construction project for conformance with zoning rules as defined with the computable files; storing the building code conformance report to a database of the computing device; and/or transforming or converting, by the computing device, a building code regulation into a computable record that defines a building design rule for the building code regulation.

In one or more aspects of the system/method, the computing device executes a neural network to perform tasks associated with the building permit review; the neural network outputs prediction confidence data for a building code conformance review of the construction project; the neural network undergoes supervised training to improve accuracy of building code conformance review of construction projects; and/or the neural network undergoes unsupervised training to improve accuracy of building code conformance review of construction projects.

The above description of the disclosed embodiments is provided to enable any person skilled in the art to make or use the invention. Various modifications to these embodiments will be readily apparent to those skilled in the art, and the general principles described herein can be applied to other embodiments without departing from the spirit or scope of the invention. Thus, it is to be understood that the description and drawings presented herein represent a presently preferred embodiment of the invention and are therefore representative of the subject matter which is broadly contemplated by the present invention. It is further understood that the scope of the present invention fully encompasses other embodiments that may become obvious to those skilled in the art and that the scope of the present invention is accordingly not limited.

Combinations, described herein, such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, and any such combination may contain one or more members of its constituents A, B, and/or C. For example, a combination of A and B may comprise one A and multiple B's, multiple A's and one B, or multiple A's and multiple B's.

What is claimed is:

1. A method comprising:

transforming, using a neural network executed by at least one hardware processor, a building code regulation into a computable record that defines a building design and/or engineering rule for the building code regulation, wherein a semantic structure of the building code regulation is translated into object rules or parametric models and associated with a building permit application file information, wherein the building code regulation is transformed using a Transformation Logic Algorithm (TLA), neural Natural Language Processing (NLP) techniques, or artificial intelligence;

performing, using at least one hardware processor, design model validation, wherein design model validation comprises entering the building permit application file information and checking the building permit application file information against relevant building codes, ordinances and regulations, with or without using a taxonomy or code logic;

performing, using at least one hardware processor, exchange model code checking, wherein exchange model code checking comprises using a plurality of exchange models;

graphically displaying, by the hardware processor, an interface embedded with one or more buttons for initiating an action of code conformance checking;

performing, using at least one hardware processor, code conformance checking, wherein the code conformance checking comprises receiving a request from the exchange models and passing the building permit application file information to code checking modules configured to check building code provisions and one or more regulations per local, state, national or international requirements;

performing, using at least one hardware processor, verification reporting based on input provided from the code checking modules;

performing, using at least one hardware processor, results reporting based on findings of the verification reporting;

generating and outputting, by the neural network using at least one hardware processor, prediction confidence data for code conformance checking; and training, by at least one hardware processor, the neural network with the prediction confidence data.

2. The method of claim 1, wherein the exchange models comprise at least a building code regulations and architectural design use case exchange model, a building code regulations and structural design use case exchange model, a building code regulations and mechanical system design use case exchange model, a building code regulations and electrical design use case exchange model, a building code regulations and plumbing design use case exchange model, a building code regulations and fire protection design use case exchange model, and a building code regulations and results reporting use case exchange model.

3. The method of claim 1, wherein the code checking modules comprise at least an architectural design checking module, a structural design checking module, a mechanical, electrical, plumbing design checking module, or a fire protection design checking module.

4. The method of claim 1, further comprising applying, in a feedback loop, an inaccurate prediction of code conformance to the neural network.

5. The method of claim 4, wherein the neural network is trained using a supervised or unsupervised learning method.

6. A system comprising:

at least one hardware processor; and one or more software modules that are configured to, when executed by the at least one hardware processor:

transform, using a neural network executed by the at least one hardware processor, a building code regulation into a computable record that defines a building design and engineering rule for the building code regulation, wherein a semantic structure of the building code regulation is translated into object rules or parametric models and associated with a building permit application file information, wherein the building code regulation is transformed using a Transformation Logic Algorithm (TLA), the neural Natural Language Processing (NLP) techniques, or artificial intelligence;

perform design model validation, wherein design model validation comprises entering the building permit application file information and checking the building permit application file information against relevant codes and regulations, using a taxonomy or neural Natural Language Processing (NLP) or artificial intelligence;

perform exchange model code checking, wherein exchange model code checking comprises using a plurality of exchange models;

graphically display an interface embedded with one or more buttons for initiating an action of code conformance checking;

perform code conformance checking, wherein the code conformance checking comprises receiving a request from the exchange models and passing the building permit application file information to code checking modules configured to check building code provisions and one or more regulations per local, state, national or international requirements;

perform verification reporting based on input provided from the code checking modules;

perform results reporting results reporting based on findings of the verification reporting;

generate and output, by the neural network using the at least one hardware processor, prediction confidence data for code conformance checking; and train the neural network with the prediction confidence data.

7. The system of claim 6, wherein the exchange models comprise at least a building code regulations and architectural design use case exchange model, a building code regulations and structural design use case exchange model, a building code regulations and mechanical system design use case exchange model, a building code regulations and electrical design use case exchange model, a building code regulations and plumbing design use case exchange model, a building code regulations and fire protection design use case exchange model, and a building code regulations and results reporting use case exchange model.

8. The system of claim 6, wherein the code checking modules comprise at least an architectural design checking module, a structural design checking module, a mechanical, electrical, plumbing design checking module, or a fire protection design checking module.

9. The system of claim 6, wherein the one or more software modules are configured to, when executed by the at least one hardware processor, apply, in a feedback loop, an inaccurate prediction of code conformance to the neural network.

10. The system of claim 9, wherein the neural network is trained using a supervised or unsupervised learning method.

11. A non-transitory computer-readable medium having instructions stored therein, wherein the instructions, when executed by a processor, cause the processor to:

transform, using a neural network, a building code regulation into a computable record that defines a building design rule for the building code regulation, wherein a semantic structure of the building code regulation is translated into object rules or parametric models and associated with a building permit application file information, wherein the building code regulation is transformed using a Transformation Logic Algorithm (TLA), neural Natural Language Processing (NLP) techniques, or artificial intelligence;

perform design model validation, wherein design model validation comprises entering the building permit application file information and checking the building permit application file information against relevant codes and regulations, using a taxonomy;

perform exchange model code checking, wherein exchange model code checking comprises using a plurality of exchange models;

graphically display an interface embedded with one or more buttons for initiating an action of code conformance checking;

perform code conformance checking, wherein the code conformance checking comprises receiving a request from the exchange models and passing the building permit application file information to code checking modules configured to check building code provisions and any regulations per local, state, national or international requirements;

perform verification reporting based on input provided from the code checking modules;

perform results reporting results reporting based on findings of the verification reporting;

generate and output, using the neural network, prediction confidence data for code conformance checking; and train the neural network using the prediction confidence data.

12. The non-transitory computer-readable medium of claim 11, wherein the exchange models comprise at least a building code regulations and architectural design use case exchange model, a building code regulations and structural design use case exchange model, a building code regulations and mechanical system design use case exchange model, a building code regulations and electrical design use case exchange model, a building code regulations and plumbing design use case exchange model, a building code regulations and fire protection design use case exchange model, and a building code regulations and results reporting use case exchange model.

13. The non-transitory computer-readable medium of claim 11, wherein the code checking modules comprise at least an architectural design checking module, a structural design checking module, a mechanical, electrical, plumbing design checking module, or a fire protection design checking module.

14. The non-transitory computer-readable medium of claim 11, wherein the instructions, when executed by a processor, cause the processor to apply, in a feedback loop, an inaccurate prediction of code conformance to the neural network.

* * * * *